United States Patent
Zhou et al.

(10) Patent No.: US 10,317,476 B2
(45) Date of Patent: Jun. 11, 2019

(54) BUS-BASED INFORMATION COLLECTION SYSTEM WITH MICRO POWER CONSUMPTION FOR BATTERY PACKAGES

(71) Applicant: Hangzhou Xieneng Technology Co., LTD., Hangzhou (CN)

(72) Inventors: Xunwei Zhou, Hangzhou (CN); Xiaojie Li, Hangzhou (CN); Xi Yan, Hangzhou (CN); Jiale Shu, Hangzhou (CN)

(73) Assignee: HANGZHOU XIENENG TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 15/632,041

(22) PCT Filed: Dec. 25, 2015

(86) PCT No.: PCT/CN2015/099024
§ 371 (c)(1),
(2) Date: Jun. 23, 2017

(87) PCT Pub. No.: WO2016/101921
PCT Pub. Date: Jun. 30, 2016

(65) Prior Publication Data
US 2018/0024197 A1    Jan. 25, 2018

(30) Foreign Application Priority Data
Dec. 25, 2014   (CN) .................... 2014 2 0842703 U

(51) Int. Cl.
*G01R 31/36*    (2019.01)
*G01R 31/382*   (2019.01)
(Continued)

(52) U.S. Cl.
CPC .......... *G01R 31/382* (2019.01); *G01R 31/44* (2013.01); *G06F 1/263* (2013.01);
(Continued)

(58) Field of Classification Search
None
See application file for complete search history.

(56) References Cited

U.S. PATENT DOCUMENTS

| | | | |
|---|---|---|---|
| 2008/0007222 A1* | 1/2008 | Nance | G01R 31/3693 320/128 |
| 2014/0129164 A1* | 5/2014 | Gorbold | G01R 31/362 702/63 |

* cited by examiner

*Primary Examiner* — Jermele M Hollington
*Assistant Examiner* — Suresh K Rajaputra
(74) *Attorney, Agent, or Firm* — Treasure IP Group, LLC

(57) ABSTRACT

A bus-based information collection system with micro power consumption for battery packages comprises a plurality of batteries (1) connected in series, each of the batteries (1) is connected to a separate sampling board (2) which is sampling information of the batteries, each of the sampling board (2) is mounted near a corresponding battery (1) and is connected to a communication bus (4) arranged nearby, the communication bus (4) is connected to a secondary control board (3) used for data summarization. For each of the batteries (1) there is one sampling board (2) arranged nearby, each of the sampling boards (2) is proximally connected to the communication bus (4), and a wire is led from the communication bus (4) to the secondary control board (3), so that the wire harness inside the battery box are greatly simplified and sampling errors caused by long wire, electromagnetic interference, and the interference of various unpredictable problems can be effectively reduced. Furthermore, each of the sampling board (2) is relatively independent, such that the present disclosure may be suitable for any grouping forms of the battery, which avoids redesigning the battery information collection system for different grouping forms and guarantees portability and extensibility of the solution.

6 Claims, 1 Drawing Sheet

(51) Int. Cl.
  *H02J 7/00*    (2006.01)
  *G06F 1/26*    (2006.01)
  *G06F 13/42*   (2006.01)
  *G01R 31/44*   (2006.01)
  *G01R 31/374*      (2019.01)
  *H02J 13/00*       (2006.01)

(52) U.S. Cl.
  CPC ............ *G06F 13/4282* (2013.01); *H02J 7/00* (2013.01); *H02J 7/0021* (2013.01); *G01R 31/374* (2019.01); *H02J 13/0003* (2013.01); *Y02D 10/14* (2018.01); *Y02D 10/151* (2018.01)

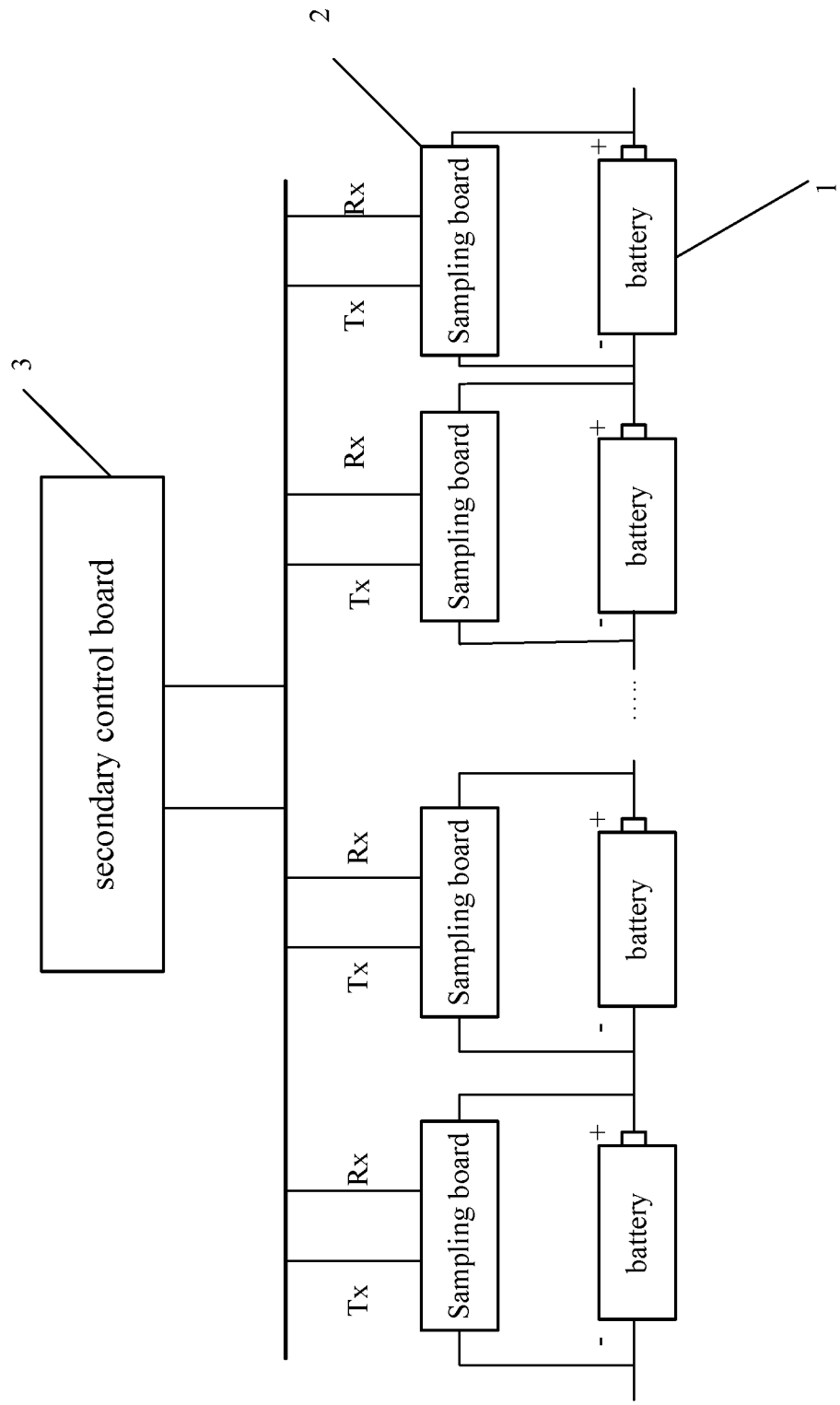

BUS-BASED INFORMATION COLLECTION SYSTEM WITH MICRO POWER CONSUMPTION FOR BATTERY PACKAGES

CROSS-REFERENCE TO RELATED APPLICATION

This application claims the benefit of Chinese Patent Application No. 201420842703.4, filed on Dec. 25, 2014, which is incorporated herein by reference in its entirety.

BACKGROUND OF THE DISCLOSURE

Field of the Disclosure

The disclosure relates to a bus-based information collection system with micro power consumption for battery packages.

Background of the Disclosure

A battery information collection system is an important part of a battery management system, it is responsible for real-time collection of all electrical and thermal information of the battery and providing data support for the battery management system.

The conventional battery information collection system collects information in an integrated mode, that is, the collection system which uses as a separate PCB (printed circuit board) obtains collected information of each sampling point through conductive wires and then centrally processes the semaphores using a collection module. In general, a convention battery information collection solution is mainly based on the collection solution of a LTC6802 chip.

The LTC6802 chip manufactured by Linear Technology Company is used to sample the battery voltages of battery packages consisting of 12 batteries in series, and it is usually applied to a battery management system for a lithium or lead-acid battery package consisting of 24 or 36 batteries in series. A battery management system for a battery package consisting of 24 batteries in series is taken as an example here: 25 sampling wires or 26 sampling wires (including two BAT12) need to be led from the 25 sampling points of the batteries to a sampling board, meanwhile, at least four temperature probes which correspond to 8 wires need to be placed in a battery box of the battery packages, and the 8 wires of the four temperature probes are led to the sampling board; then the LTC6802 chip converts 28 analog signals in all into digital signals and transfers the digital signals to a single chip microcomputer. If additional sampling information is required, for example, the number of the temperature sampling points is increased from 4 to 24, it is necessary to add sampling chips on the sampling board or change the temperature sampling solution. This conventional battery information collection solution has following disadvantages.

First, the conventional battery information collection system has a large amount of wires, leading to complexity. The semaphores need to be led to the sampling module through the wires in integrated information collection, so that the amount of the wires increases with the increase of the amount of the semaphores being needed to be collected, and the required size of the battery box increases accordingly.

Second, the conventional battery information collection system has serious interference problem. The semaphores are basically analog signals before being led to the sampling module, so that the analog signals are very susceptible to various electromagnetic interference, which will make the data obtained by the sampling module untrustworthy.

Third, the conventional battery information collection system cannot be extended. The conventional collection system is based on integrated mode, it is developed for a battery package with a specific grouping form, that is, if the grouping form of a battery package changes, especially the number of the series batteries in the battery package is increased (for example, the number of the series batteries in the battery package changes from 24 to 36), the conventional collection system needs to be redesigned and rewired.

Fourth, the power consumption of the conventional battery information collection system is large. Since the multi-channel information of the battery is sampled under the integrated mode, a high-speed ADC is needed to meet the requirement of the sampling frequency, and high speed means high power consumption. However, for the battery management system, increasing battery life is a main purpose, so excessive power consumption of the battery is clearly unacceptable. Here, a single LTC6802 chip with 12 lithium iron phosphate batteries in series are taken as an example, the total voltage of the 12 lithium iron phosphate battery package is approximately equal to 38.4V, the current of the LTC6802 chip at steady state is about 62.5 $\mu A$, so the total of real power consumption is about 38.4V*62.5 $\mu A$=2.4 mW.

SUMMARY OF THE DISCLOSURE

The disclosure provides a bus-based information collection system with micro power consumption for battery packages, which has advantages including small wiring harness, high extensibility and low power consumption.

According to the disclosure, there is provided a bus-based information collection system with micro power consumption for battery package, including a plurality of batteries connected in series, each of the batteries is connected to a separate sampling board which samples information of a corresponding battery, each of the sampling boards is mounted near a corresponding battery and connected to a communication bus arranged nearby, said communication bus is connected to a secondary control board which is used for data summarization. In the embodiment, for each of the batteries there is one sampling board arranged nearby, each of the sampling boards is proximally connected to the communication bus and a wire is led from the communication bus to the secondary control board, so that the wiring harness inside the battery box are greatly simplified and sampling errors caused by a long wire, an electromagnetic interference and the interference of various unpredictable problems can be effectively reduced. Furthermore, each of the sampling boards is relatively independent, such that the present disclosure may be suitable for any grouping forms of the battery package, which avoids redesigning the battery information collection system for different grouping forms and guarantees the portability and extensibility of the solution.

Further, the sampling board according to the embodiment uses a KL series single chip microcomputer. The sampling board, the size of which is minimized, can not only be placed in the battery box, but can also be packed into the battery pack in battery manufacturing process. The sampling board which is in the battery package since the "birth" of the battery package can be referred as a "life recorder" of the batteries in the battery package.

Further, the single chip microcomputer of the sampling board which is for collecting information from a battery, has a power supply interface which is connected to the battery for charging. Since the power of the single chip microcomputer is supplied by the battery, a power source can be omitted so as to reduce the size of the sampling board, that is, the power of the single chip microcomputer is supplied directly by the battery, which indicates that the ADC module of the sampling board cannot obtain directly the battery voltage. Specifically in the embodiment, the battery voltage is taken as a reference voltage, and then a calibrated voltage value IV is read from the chip, and the values by the ADC module can be derived reversely the voltage value of the battery obtained.

Further, various sensors, including some necessary sensors such as temperature sensor and voltage sensor, are mounted on the sampling board for collecting different battery information. The sensors can also be added according to users' requirements.

Further, an optical coupler is mounted on the sampling board for isolation and the two terminal voltage levels of the optical coupler are opposite. Data transmission wires are isolated from an upper data summary unit by the optical coupler. In order to transmit data through bus, the communication bus is designed by reference to the design of IIC bus under the consideration of specific characteristics of UART, and finally the bus communication of UART is realized through the optical coupler.

Further, the static power consumption of the sampling board according to the embodiment is less than 3 μA. For example, the power consumption of 12 sampling boards corresponding to 12 iron phosphate lithium batteries in series, which is equal to 3.2V*3 ρA*12=115.2 μW=0.1152 mW, is much less than the power consumption of the scheme using the LTC6802, and thus it is guaranteed to a large extent that the battery life will not be negatively influenced by the battery information collection system. Furthermore, each sampling board corresponds to its own window time, each sampling board sends data only during the corresponding window time and goes into low power consumption mode by sleeping during other time in order to reduce power consumption.

The disclosure has the following beneficial effects.

First, the wiring harness of the battery information collection system according to the disclosure is simple. The disclosure uses a discrete sampling method to sample the information of the battery nearby, and then performs analog-to-digital conversion to obtain digital signals near the battery, and then transmits the battery information to the control unit through the digital bus, so that the wiring harness inside the battery box can be greatly simplified, and as a result, compared with the conventional system which has dozens of sampling wires, this disclosure only has four digital communication wires.

Second, the size of the battery information collection system according to the disclosure is small. The sampling board can be placed inside the battery package or be placed besides the near single battery, the size of the sampling board is small and the size of the data collection center which is mounted on the sampling board is also greatly reduced.

Third, the battery information collection system according to the disclosure has low power consumption. For the conventional scheme using the LTC6802 corresponding to 12 iron phosphate lithium batteries in series, the static power consumption of the battery information collection system is 2.4 mW. While the static power consumption of the disclosure is less than 0.1152 mW, i.e. 115.21 W, so that the micro power consumption design is realized.

Fourth, the battery information collection system according to the disclosure is extensible. Each of the sampling boards is independent, so that, for a variety of different grouping forms, the only thing required for forming a complete battery information collection system is to configure the quantity of the corresponding sampling boards in accordance with the number of the batteries in the battery packages. Meanwhile, the disclosure supports the access of various sensors to collect other necessary information.

BRIEF DESCRIPTION OF THE DRAWINGS

FIG. 1 is a schematic circuit diagram according to one embodiment of the present disclosure.

DETAILED DESCRIPTION OF THE DISCLOSURE

The disclosure is described in connection with specific embodiments, but the disclosure is not limited to these embodiments. Those skilled in the art should be aware that the present disclosure encompasses all alternatives, modifications and equivalents that may be included within the scope of the claims.

Referring to FIG. 1, a battery information collection system of a bus micro-power consumption for battery packages includes a plurality of batteries 1 connected in series, each of the batteries 1 is connected to a separate sampling board 2 and is sampled by the separate sampling board to provide information, every sampling board 2 is mounted near a corresponding battery and is connected to a communication bus 4 arranged nearby, and said communication bus 4 is connected to a secondary control board 3 used for data summarization. In this embodiment, each of the batteries 1 corresponds to a sampling board 2 provided nearby, each of the sampling boards 2 is proximally connected to the communication bus 4 and then a wire is led from the communication bus 4 to the secondary control board 3, so that the wire harness in the box are greatly simplified and sampling errors caused by long wire, electromagnetic interference and the interference of various unpredictable problems are effectively reduced. Furthermore, each of the sampling boards 2 is relatively independent, such that the present disclosure may be suitable for any grouping forms of the battery, which eliminates the need for redesigning the battery information collection system for different grouping forms and guarantees portability and extensibility of the solution.

The sampling board 2 according to the embodiment uses a KL series single chip microcomputer. The sampling board 2, the size of which is minimized, can not only be placed in the battery box, but can also be packed into a battery package in battery manufacturing process. The sampling board 2 which is in the battery package since the "birth" of the battery package can be referred as a "life recorder" of the batteries in the battery package.

In this embodiment, the single chip microcomputer of the sampling board 2 which is sampling a battery, is powered by the battery which is connected to a power sup ply interface of said single chip microcomputer. Since the power of the single chip microcomputer is supplied by the battery, a power source can be omitted so as to reduce the size of the sampling board 2, that is, the power of the single chip microcomputer is supplied directly by the battery 1, which indicates that the ADC module of the sampling board 2 cannot obtain directly the voltage of the battery 1. Specifically in the embodiment, the voltage of the battery 1 is taken as a reference voltage, and then a calibrated voltage 1V is read from the chip, and the values by the ADC module can be derived reversely the voltage value of the battery obtained.

In the embodiment, various kinds of sensors, including some necessary sensors such as temperature sensor and voltage sensor, are mounted on the sampling board 2 for collecting different battery information. The sensors can also be added according to users' requirements.

In the embodiment, an optical coupler (not shown in FIG. 1) is mounted on the sampling board 2 for isolation, and the two terminal voltage levels of the optical coupler are opposite. Data transmission wires are isolated from an upper data summary unit by the optical coupler. In order to transfer data through bus, the communication bus is designed by reference to the design of IIC bus under the consideration of specific characteristics of UART, and finally the bus communication of UART is realized through the optical coupler. The voltage levels at the two terminals of the optical coupler are set to be opposite in order to meet requirements of low power design.

The static power consumption of the sampling board 2 according to the embodiment is less than 31 µA. For example, the power consumption of 12 sampling boards corresponding to 12 iron phosphate lithium batteries in series, which is equal to 3.2V*3 µA*12=115.21 µW=0.1152 mW, is much less than the power consumption of the scheme using the LTC6802, and thus it is guaranteed to a large extent that the battery life will not be negatively influenced by the battery information collection system. Furthermore, each sampling board 2 corresponds to its own window time, each sampling board sends data only during the corresponding window time, and during other time, each sampling board automatically goes into a sleep mode, that is, a low power consumption mode in order to reduce the power consumption.

The invention claimed is:

1. A bus-based information collection system with micro power consumption for battery packages comprising a plurality of batteries connected in series, wherein each of said plurality of batteries is connected to a separate sampling board which samples information of a corresponding battery, each of said sampling boards is mounted near a corresponding battery and is connected to a communication bus arranged nearby, and said communication bus is connected to a secondary control board used for data summarization, wherein each of said plurality of sampling boards is directly connected to said secondary control board by said communication bus for sending said information separately, wherein each of said sampling boards is powered by said corresponding one of said plurality of batteries, and is configured to derive a voltage value of said corresponding one of said plurality of batteries in accordance with a sensed voltage of said corresponding one of said plurality of batteries and a calibrated voltage.

2. The bus-based information collection system with micro power consumption for battery packages according to claim 1, wherein said sampling board uses a KL series single chip microcomputer.

3. The bus-based information collection system with micro power consumption for battery packages according to claim 1, wherein said single chip microcomputer of said sampling board which is for sampling a battery of said plurality of batteries, is powered by the battery which is connected to a power supply interface of said single chip microcomputer.

4. The bus-based information collection system with micro power consumption for battery packages according to claim 1, wherein various sensors are mounted on said sampling board for collecting different battery information.

5. The bus-based information collection system with micro power consumption for battery packages according to claim 1, wherein an optical coupler is mounted on said sampling board for isolation, and two terminal voltage levels of said optical coupler are opposite.

6. The bus-based information collection system with micro power consumption for battery packages according to claim 1, wherein static power consumption of said sampling board is less than 3 µA.

* * * * *